United States Patent
Takamura et al.

(10) Patent No.: US 10,685,820 B2
(45) Date of Patent: Jun. 16, 2020

(54) MONOCRYSTALLINE SILICON SPUTTERING TARGET

(71) Applicant: JX Nippon Mining & Metals Corporation, Tokyo (JP)

(72) Inventors: Hiroshi Takamura, Ibaraki (JP); Ryosuke Sakashita, Ibaraki (JP); Shuhei Murata, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 199 days.

(21) Appl. No.: 15/889,278

(22) Filed: Feb. 6, 2018

(65) Prior Publication Data

US 2018/0226236 A1    Aug. 9, 2018

(30) Foreign Application Priority Data

Feb. 6, 2017    (JP) .................................. 2017-019937

(51) Int. Cl.
| | |
|---|---|
| *H01J 37/34* | (2006.01) |
| *C23C 14/14* | (2006.01) |
| *C23C 14/34* | (2006.01) |

(52) U.S. Cl.
CPC .......... *H01J 37/3426* (2013.01); *C23C 14/14* (2013.01); *C23C 14/3414* (2013.01); *H01J 37/3423* (2013.01)

(58) Field of Classification Search
CPC .. C23C 14/14; C23C 14/3414; H01J 37/3423; H01J 37/3426

USPC ............. 204/298.12, 298.13, 192.23, 192.25
See application file for complete search history.

(56) References Cited

U.S. PATENT DOCUMENTS

| | | | |
|---|---|---|---|
| 5,510,011 A | * | 4/1996 | Okamura ................ C23C 14/34 117/105 |
| 7,459,720 B2 | | 12/2008 | Ohmi et al. |
| 7,998,324 B2 | | 8/2011 | Watanabe et al. |
| 8,236,428 B2 | | 8/2012 | Satoh et al. |
| 8,252,422 B2 | | 8/2012 | Takamura et al. |
| 8,512,868 B2 | | 8/2013 | Suzuki et al. |
| 8,647,747 B2 | | 2/2014 | Takamura et al. |
| 8,659,022 B2 | | 2/2014 | Suzuki et al. |
| 8,987,737 B2 | | 3/2015 | Takamura et al. |
| 9,053,942 B2 | | 6/2015 | Takamura et al. |

(Continued)

FOREIGN PATENT DOCUMENTS

| | | | |
|---|---|---|---|
| EP | 1898450 | * | 3/2008 |
| JP | S56-109896 A | | 8/1981 |

(Continued)

*Primary Examiner* — Rodney G McDonald
(74) *Attorney, Agent, or Firm* — Howson & Howson LLP

(57) ABSTRACT

A sputtering target formed from monocrystalline silicon is provided, wherein a sputter surface of the sputtering target is a plane inclined at an angle that exceeds 1° and is less than 10° from a {100} plane. The sputtering target formed from monocrystalline silicon provides a sputtering target which yields superior mechanical strength as well as exhibiting a sputter performance which is equivalent to that of a {100} plane. From a different perspective, in addition to superior mechanical strength, the monocrystalline silicon sputtering target yields superior particle characteristics, sputtering rate, crack resistance, surface shape uniformity and other characteristics.

17 Claims, 3 Drawing Sheets

(56) References Cited

U.S. PATENT DOCUMENTS

| | | |
|---|---|---|
| 9,566,618 B2 | 2/2017 | Yuan et al. |
| 2010/0016144 A1* | 1/2010 | Suzuki .............. H01L 21/02002 |
| | | 501/92 |
| 2010/0187661 A1 | 7/2010 | Suzuki et al. |
| 2010/0330325 A1 | 12/2010 | Suzuki et al. |
| 2015/0001069 A1 | 1/2015 | Takamura et al. |
| 2016/0260591 A1 | 9/2016 | Zhang |

FOREIGN PATENT DOCUMENTS

| | | |
|---|---|---|
| JP | H10-247731 A | 9/1998 |
| JP | H11-079890 A | 3/1999 |
| JP | 2002-003295 A | 1/2002 |
| JP | 2008-091887 A | 4/2008 |

* cited by examiner

MONOCRYSTALLINE SILICON SPUTTERING TARGET

BACKGROUND

The embodiment of the present invention relates to a silicon (Si) sputtering target, and in particular relates to a sputtering target formed from monocrystalline silicon which is free from cracking and exhibits high sputtering performance even when high power is input.

Silicon is the basic material of modern semiconductor electronic devices, and many of the semiconductor electronic devices are formed using silicon-based materials excluding those that are used for special purposes. Silicon is also broadly used in the form of pure silicon or a silicon compound not only as a substrate material on which various elements and devices are formed, but also as a material for partially forming various constituent elements in the devices.

When silicon or a silicon compound is formed as a constituent element other than a bulk-shaped substrate, such silicon or silicon compound in the form of a thin film having a predetermined thickness is often used in an area of a predetermined range. For example, a polycrystalline silicon film is used as an electrode or an active layer of semiconductor devices or in solar cells; a silicon oxide film is used as a gate insulation film or an element isolation layer of a field effect transistor (FET) structure or as an optical adjustment film; and a silicon nitride film is used as a device protective layer for preventing the diffusion of water and nitrogen, and as a mask for use upon selectively oxidizing silicon.

This kind of silicon or silicon compound thin film is produced by suitably selecting the thin film forming method according to usage and purpose. Conventionally, the chemical vapor deposition (CVD) method was often used in light of superior characteristics such as deposition rate and step coverage. Nevertheless, in recent years, the sputtering method is also being used in cases where a silicon film or a silicon compound film is formed as a part of a composite device based on a combination with a material having low heat resistance properties, and in terms of the superiority of process for usages in which high purity and strict film thickness control are required.

When forming a silicon film or a silicon compound film based on the sputtering method, a sputtering target formed from a silicon material is required. In relation to a silicon sputtering target, as described in Patent Documents 1 and 2, known is a target formed from a silicon sintered body which is obtained by subjecting powdered silicon grains to densification and sintering. With this kind of sintered target, there are problems of impurity inclusion and oxidation during the pulverization and sintering of the raw material powder. As a type capable of resolving the foregoing problems, known is a sputtering target which uses polycrystalline silicon produced via the melting method as described in Patent Document 3.

As described above, the technology of silicon materials has been established as a result of numerous means and findings for producing a high purity monocrystal as a substrate material of semiconductor devices being accumulated over the years. Especially in recent years, the production of a large diameter silicon ingot having a diameter of 300 mm, and even 450 mm, has been realized. In line with this, the use of monocrystalline silicon, in which the production technology of high purity products has been established, as a sputtering target is being considered. Patent Document 4 describes the use of a monocrystalline silicon ingot having a diameter of 300 mm or more as a sputtering target.

Nevertheless, when monocrystalline silicon is actually used as a sputtering target, as also indicated in Patent Document 2, it is known that crystalline silicon cracks easily and there are issues regarding mechanical strength. The conventional knowledge regarding the strength of monocrystalline silicon is described in Patent Documents 5 and 6. Patent Document 5 describes that a wafer-shaped silicon in which the plane orientation of the main surface is {111} by subjecting the main surface of a wafer to be inclined at a predetermined angle from a {111} plane in order to prevent the occurrence of slippage due to thermal stress during the production process.

Meanwhile, when using monocrystalline silicon as a large-area sputtering target, the {100} plane is often used as the sputter surface. When growing monocrystalline silicon having a large diameter, this is limited to <100> axis crystals in which the glide dislocation of seed crystals can be eliminated easily. In other crystal orientations, the diameter of the monocrystalline silicon needs to be narrowed down considerably during the necking process, because a large product with a large diameter and heavy weight cannot be pulled. And conventionally, when obtaining a large-area silicon sputtering target, the target was cut into a disk shape on a plane that is perpendicular to the axis direction of the <100> monocrystalline ingot pulled with the CZ method, and the {100} plane was used as the sputter surface of the target.

With regard to a silicon wafer in which the main surface is the {100} plane, Patent Document 6 describes the problem of the wafer cracking along the {110} plane as the cleaved surface that is perpendicular to the {100} plane during the production process. In order to solve the problem, Patent Document 6 describes a wafer with increased strength that is resistant to cracks by causing the main surface of the wafer to be a plane that is inclined at a predetermined inclination angle relative to all equivalent <110> orientations. Nevertheless, with regard to monocrystalline silicon having a certain degree of thickness such as with a sputtering target, there is no disclosure as to the specific level that the strength can be improved by actually inclining the orientation to what degree.

It is known that, in the field of silicon wafers, types in which the main surface of the wafer is of a slightly inclined plane by being inclined at a predetermined angle from a generally used low-index plane such as {100} or {111} as disclosed in Patent Documents 7 to 10 for the purpose of inhibiting defects, improving flatness and improving impurity gettering power of an epitaxial layer to be grown on the wafer. However, these documents do not cause the main surface to be a plane inclined relative to the low-index plane from the perspective related to the strength of monocrystalline silicon, let alone sputter characteristics.

CITATION LIST—PATENT DOCUMENTS

Patent Document 1: International Publication No. 2005/031028
Patent Document 2: JP 2015-212413 A
Patent Document 3: International Publication No. 2013/115289
Patent Document 4: Japanese Translation of PCT International Application Publication No. JP 2015-504479 A
Patent Document 5: JP H11-079890 A
Patent Document 6: JP 2002-025874 A Patent Document 7: JP S56-109896 A
Patent Document 8: JP H10-247731 A
Patent Document 9: JP 2002-003295 A
Patent Document 10: JP 2008-091887 A

SUMMARY

As described above, particularly with a large-area sputtering target, while there are demands for a sputtering target formed from monocrystalline silicon in which the plane orientation of the sputter surface is the {100} plane, the monocrystalline silicon has a drawback in that it is susceptible to cracking. Moreover, with regard to a wafer to be used as the substrate on which the device is to be formed, there is a publication that discloses a technology for improving the strength of the {100} monocrystalline silicon wafer, but this publication does not disclose any technical knowledge as a sputtering target.

With a sputtering target, in cases where it is to be used in a large area and with high power (density) as anticipated in the embodiment of the present invention, while ion bombardment caused by high density plasma will locally occur at the erosion part on the sputter surface on the one hand, the effect of the target being cooled from the rear surface will occur at the non-erosion part where hardly any plasma exists on the other hand, and a considerable deviation in the thermal load will arise in the plane of the target. Accordingly, the status of the load, strain and damage encountered by the silicon surface of the target material is considerably different from the status that a normal silicon wafer will encounter during the device formation process.

Furthermore, when a silicon material is to be used as the sputtering target, there is a problem in that sufficient performance needs to be exhibited also with regard to the unique characteristics that are required in a sputtering target such as the prevention of abnormal discharge and consequential suppression of the generation of particles, favorable sputtering rate, sufficient resistance against cracking and chipping during sputtering, and improvement in the uniformity of the target surface shape which affects the deposition uniformity.

The embodiment of the present invention was devised in view of the foregoing technical issues, and an object of this invention is to provide a sputtering target formed from monocrystalline silicon having a sputter surface which exhibits a sputter performance which is equivalent to that of a {100} plane, and which also yields superior mechanical strength. Moreover, from a different perspective, this invention aims to provide a monocrystalline silicon sputtering target which yields superior particle characteristics, sputtering rate, crack resistance, surface shape uniformity and other characteristics in addition to superior mechanical strength.

As a result of intense study, the present inventors discovered that both the mechanical strength and the sputtering characteristics can be improved by causing the sputter surface of a sputtering target formed from monocrystalline silicon to substantially be a {100} plane and causing the sputter surface to have a greater average bending strength in comparison to a case where the sputter surface is a {100} plane, and completed the embodiment of the present invention.

Based on the foregoing discovery, the embodiment of the present invention provides the following:

A sputtering target formed from monocrystalline silicon, wherein a sputter surface of the sputtering target is a plane inclined at an angle that exceeds 1° and is less than 10° from a {100} plane. A mean value of three-point bending strengths at angles of 0°, 15°, 30°, and 45° relative to a baseline which passes through a center of the sputter surface may be 150 MPa or more and a ratio of a difference between a maximum value and a minimum value relative to the mean value of the three-point bending strengths may be 4.0% or less. The sputter surface may be a plane in which the {100} plane is rotated around a <110> axis or a plane in which the {100} plane is rotated around a <100> axis. The angle may be 2° or more and 8° or less, and the monocrystalline silicon may contain a p-type dopant or an n-type dopant. The sputtering target may have a diameter of 300 mm or more and a thickness of 4 mm or more.

According to the embodiment of present invention, it is possible to increase the strength of a sputtering target formed from monocrystalline silicon, in which the sputter surface is substantially a {100} plane, against stress caused by deviation in the thermal load during sputtering, and thereby prevent the cracking of the target throughout the target life. Moreover, if the crystal anisotropy can be alleviated in comparison to a target in which a low-index plane is exposed as the sputter surface, it is also possible to yield the effect of being able to realize the sputtering characteristics of uniform deposition and few particles.

DETAILED DESCRIPTION

Figure 1:
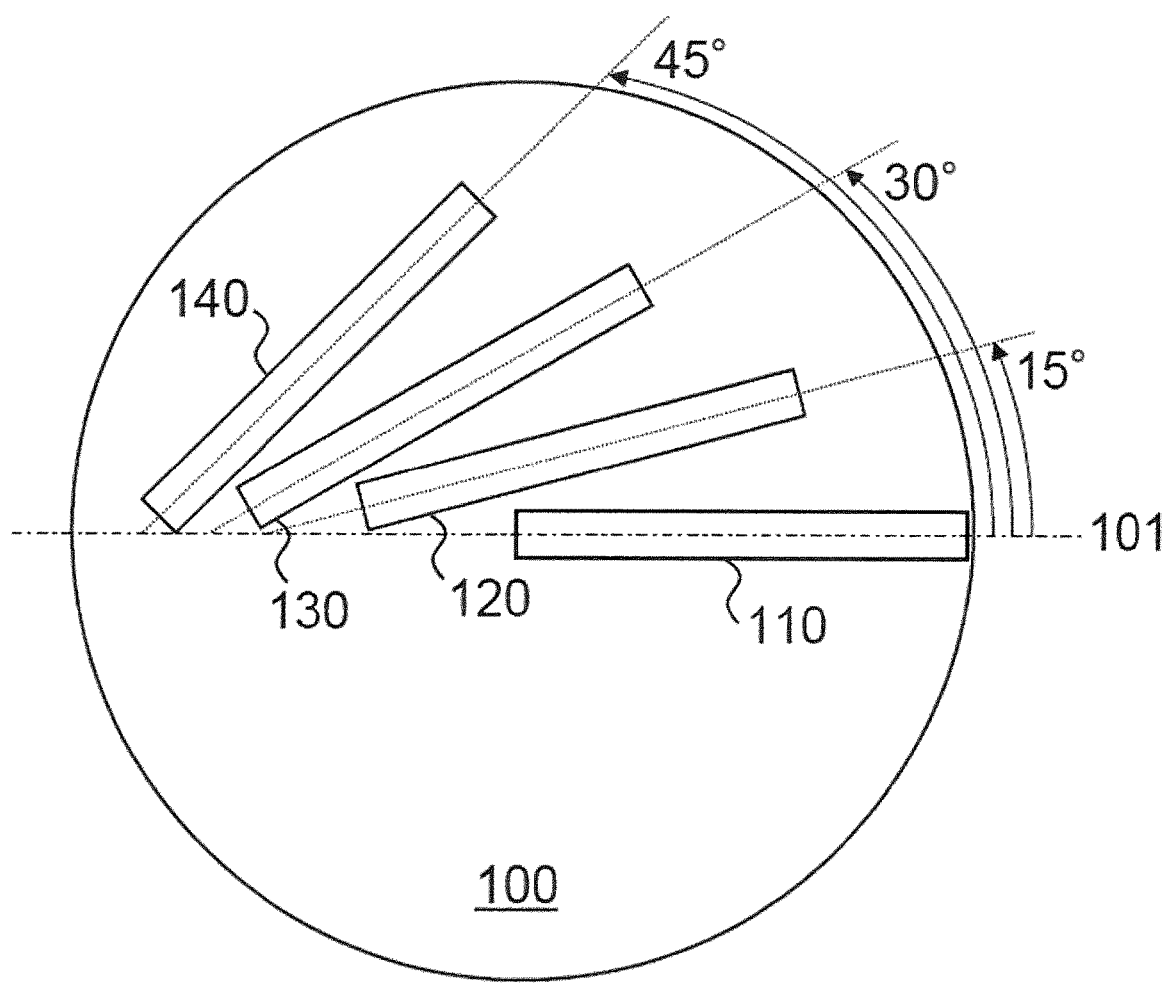
FIG. 1 is a diagram showing a method of cutting the three-point bending strength evaluation samples.

With the sputtering target of the embodiment of the present invention, the target body part to be sputtered is formed from monocrystalline silicon, and the monocrystalline silicon has, as its main surface, a sputter surface that substantially contributes to sputtering. Here, the term "main surface" refers to the plane with the largest area among the exposed planes. The shape of the main surface may be a predetermined shape such as a circular shape, an oval shape, a rectangular shape, a polygonal shape other than a rectangular shape, or a shape having a radius of curvature in which the apex of the polygonal shape is finite.

The sputtering target of the embodiment of the present invention may also be a complex configured from a target body formed from monocrystalline silicon, and a backing plate provided in close contact with the target body. The backing plate may be formed from copper, titanium, molybdenum, chromium, nickel, silicon, zinc, aluminum, or an alloy including one or more types of these elements, or a material of a bonded body. The target body and the backing plate may also be closely bonded using a bonding material. As one preferred mode, considered may be disposing a plane, which substantially has the same shape as the main surface of the target body, on a rear surface which is substantially parallel to the main surface, and closely bonding the rear surface and one surface of the backing plate via a bonding material.

With the monocrystalline silicon configuring the sputtering target body of the embodiment of the present invention, the plane as the main surface and which becomes the sputter surface is a flat surface inclined at an angle within a range that exceeds 1° and is less than 10° from a {100} plane. This inclination angle refers to the angle formed by the sputter surface and the {100} plane. As a monocrystalline silicon sputtering target, a type having the {100} plane as its sputter surface was conventionally used, and the process parameter was optimized on the premise of using a target having the {100} plane as its sputter surface. Thus, with regard to the sputtering characteristics of the target, the sputter surface preferably has a plane orientation that is close to the {100} plane so that the sputter surface of the target can exhibit performance that is equivalent to that of the {100} plane.

When the inclination angle of the sputter surface is 1° or less, it is difficult to improve the bending strength of the target, and sufficient strength against cracking or chipping that causes a cleaved surface to become exposed cannot be obtained. Meanwhile, when the inclination angle of the sputter surface of the target becomes 10° or more, it is no longer possible to exhibit the same level of sputter performance as the {100} plane. The detailed plane orientation of the sputter surface of the target and the inclination angle from a specific plane such as the {100} plane can be determined based on the X-ray diffraction pole measuring method of irradiating a sample with X rays fixed at a given angle, simultaneously scanning the sample surface from above to a horizontal position (0° to 90°) while rotating the sample in a plane (0° to 360°), and thereby obtaining a pole figure of the diffraction plane.

Generally speaking, a {100} surface of monocrystalline silicon has a problem with mechanical strength. Namely, the {100} surface of monocrystalline silicon tends to cleave such that the {110} plane as the cleaved surface becomes exposed vertically relative to the {100} plane of the main surface, cracking or chipping tends to occur along two specific directions that intersect at right angles on the {100} surface (strictly speaking, when the surface is the (100) plane, so that the {011} plane and the {0-11} plane become exposed in the [011] direction and the [0-11] direction). Nevertheless, with the monocrystalline silicon sputtering target of the embodiment of the present invention, since the plane to become the sputter surface is a flat surface inclined at an angle that exceeds 1° from the {100} plane, the sputter surface and the cleaved surface will not intersect at right angles, and resistance against the cracking and chipping described above can be improved.

As the specific strength, when the mean value of three-point bending strengths at angles of 0°, 15°, 30°, and 45° relative to a baseline which passes through a center of the sputter surface is 150 MPa or more, it is possible to obtain a target having superior mechanical strength and resistant to cracking and chipping in comparison to a target which simply uses the {100} plane as its sputter surface.

In the embodiment of the present invention, the mean value of the three-point bending strengths described above is defined by providing a baseline 101 which passes through the center of the sputter surface on a sputter surface 100 of the target as shown in FIG. 1, preparing bending strength evaluation samples (110, 120, 130, 140) cut in a strip form at the angles of 0°, 15°, 30°, and 45° relative to the baseline 101, and averaging the deflective strengths of the samples of the respective angles evaluated based on a three-point bending test according to JIS R 1601. When this value is less than 150 MPa, the strength will not be significantly superior to a conventional target having the {100} plane as its sputter surface. Thus, the mean value of the three-point bending strengths can be 155 MPa or more, and can even be 160 MPa or more.

With the sputtering target of the embodiment of the present invention, the difference between a maximum value and a minimum value of the three-point bending strengths at the angles of 0°, 15°, 30°, and 45° relative to the baseline which passes through the center of the sputter surface described above can be 4.0% or less relative to the mean value thereof, can also be 3.0% or less, and can even be 2.5% or less. When the difference between a maximum value and a minimum value of the three-point bending strengths at the angles of 0°, 15°, 30°, and 45° relative to the baseline which passes through the center of the sputter surface described is small relative to the mean value thereof, it means that the anisotropy of the crystal orientation on the sputter surface is small. Thus, the anisotropy is also alleviated regarding the sputtering characteristics and a uniform deposition process with less orientation dependency can be realized.

Figure 2:
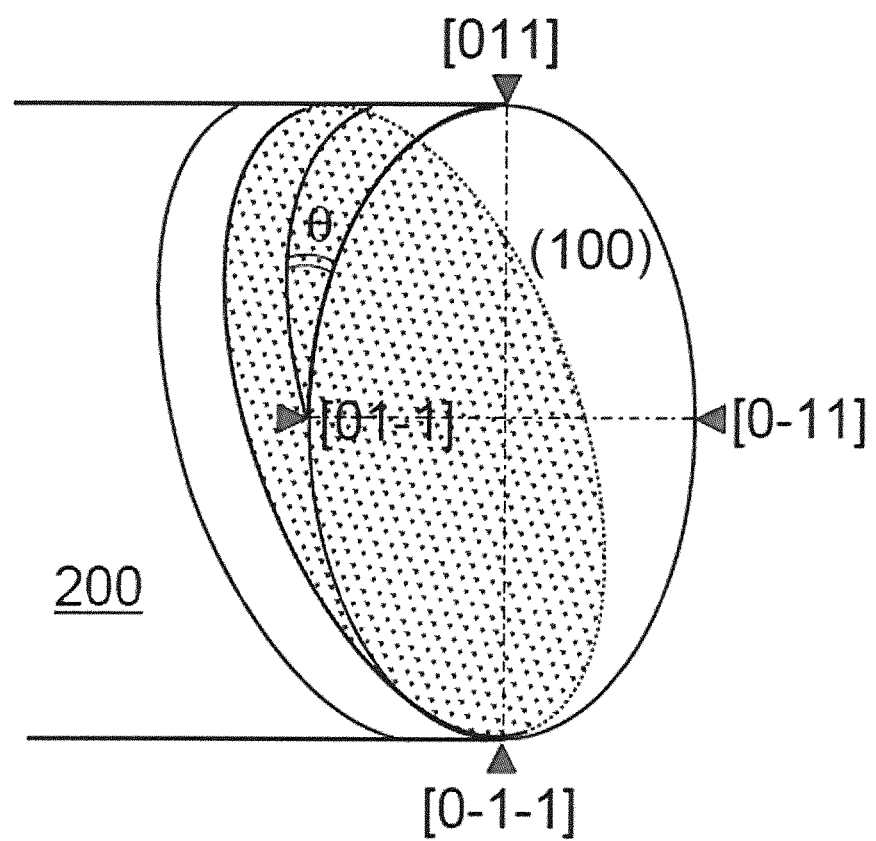
FIG. 2 is a diagram showing a method of cutting a monocrystal having a main surface inclined toward a <110> orientation from a {100} plane.
Figure 3:
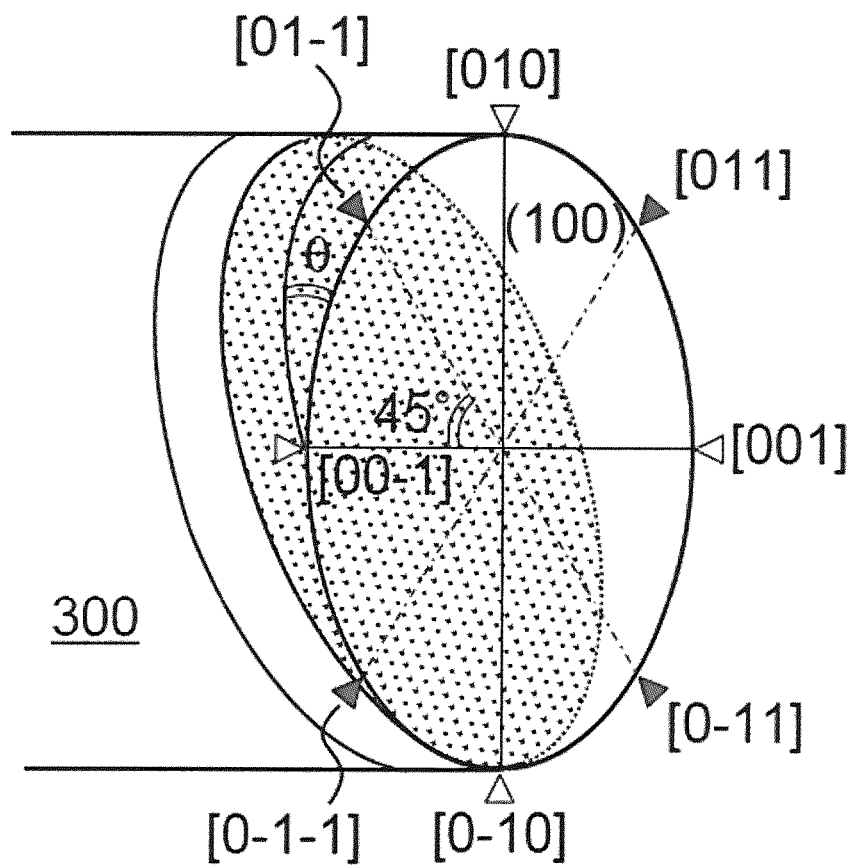
FIG. 3 is a diagram showing a method of cutting a monocrystal having a main surface inclined toward a <100> orientation from a {100} plane.

As one mode of causing the sputter surface to be a plane inclined relative to the {100} plane, as shown in FIG. 2, an inclined plane obtained by rotating the {100} plane around the <110> axis may be used. Moreover, as shown in FIG. 3, an inclined plane obtained by rotating the {100} plane around the <100> axis may also be used. As a result of using an inclined plane having the foregoing orientation, the anisotropy of the bending strength is alleviated, and the in-plane warping becomes uniform in the bonding with a backing plate having a different coefficient of thermal expansion. Alleviating the anisotropy characteristics caused by the crystal orientation of the sputter surface and causing the distribution of the warping of the target to be uniform will contribute to the uniformity of the sputter rate and the uniformity of the film thickness distribution.

The inclination angle of the sputter surface of the target is more preferably 2° or more. The inclination angle of the sputter surface is also effective at 3° or more, or 4° or more depending on the mode. Furthermore, if the inclination angle of the sputter surface is too great, the strength tends to deteriorate. From this perspective, the inclination angle of the sputter surface is preferably 9° or less, and, depending on the mode, the inclination angle of the sputter surface is also effective at 8° or less, 7° or less, or 6° or less.

The monocrystalline silicon configuring the target body may contain a dopant element for controlling the monocrystalline silicon to be a conductivity type of p-type or n-type. As p-type dopants in silicon, known are the group III (group 13) elements of boron, gallium and so on; and as n-type dopants, known are the group V (group 15) elements of phosphorus, arsenic, antimony and so on. The embodiment of the present invention may contain a predetermined amount of the foregoing dopant elements by giving consideration to the usage and characteristics of the thin film to be formed via the sputter deposition, as well as to the sputtering characteristics of the target.

A high content of the dopant element is sometimes favorable because the bulk resistivity of the target can be reduced, efficient deposition based on sputtering using a direct-current discharge (DC sputtering) is enabled, and overheating of the target caused by the sputtering current can be suppressed. The bulk resistivity of the target may be 20 Ω·cm or less in one example, and may be 10 Ω·cm or less in another example.

The sputtering target of the embodiment of the present invention has improved mechanical strength against cracking along the cleaved surface of monocrystalline silicon in comparison to a monocrystalline silicon sputtering target having a {100} on-axis plane (that is, inclination angle of 0°) as its sputter surface. This enables a large-area monocrystalline silicon having a large diameter such as a diameter of 300 mm or even a diameter of 450 mm that has been put into practical application in recent years to be effectively applied to a target body. Moreover, the deposition efficiency can also be improved since cracking can be prevented and deposition can be continued even when the power density input to the target is increased.

While the thickness of the sputtering target body can be set in consideration of characteristics such as the product life cycle and strength, the thickness may be 4 mm or more in one mode, and may be 6 mm or more in another mode. The upper limit of the target thickness may also be set in consideration of the sputter performance, weight and other factors than the strength, and may be 20 mm or less in one mode, and may be 10 mm or less in another mode.

There is no particular limitation in the production method of the sputtering target of the embodiment of the present invention, and the sputtering target may be produced by using arbitrary means. However, for the target body part formed from monocrystalline silicon, as described below, a method of off-cut slicing a monocrystalline silicon ingot of a specific orientation at a predetermined inclination angle, or a method of grinding monocrystalline silicon cut into a {100} on-axis plane at a predetermined inclination angle, is effective.

Foremost, a monocrystalline silicon ingot in which the principal axis in the longitudinal direction was promoted to become the <100> direction is prepared by a method of promoting directionality such as the Czochralski (CZ) method, the Floating Zone (FZ) method, or the Bridgeman method. Next, the monocrystalline silicon ingot is sliced (cut) at a predetermined thickness. When the cutting is performed so that the main surface of the target becomes a {100} on-axis plane, the cut plane is cut so that it intersects at right angles with the <100> axis as the principal axis of the monocrystalline ingot, but in the embodiment of the present invention, it would be effective to perform the cutting so that the sputter surface is inclined at a predetermined inclination angle relative to the {100} plane.

The inclination orientation of the main surface of the target to become the sputter surface may be set depending on which orientation that intersects at right angles with the principal axis of the ingot is used as the axis for performing the cutting at a predetermined inclination angle. For example, when the sputter surface is caused to be plane inclined in the <110> direction relative to the {100} plane, as shown in FIG. 2, by cutting a monocrystalline ingot 200 in a diagonally flat shape so as to cross the principal axis of the ingot at an inclination angle of θ around the <110> axis (while this is indicated as the [0-11] axis in FIG. 2, the equivalent orientation group is hereinafter collectively referred to as the "<110> axis") which transects in the radial direction as the center of rotation, the cut plane will also become a plane inclined in the <110> orientation relative to the {100} plane due to the 90° symmetry of the diamond structure of monocrystalline silicon.

Similarly, when causing the sputter surface to become a plane inclined in the <100> direction relative to the {100} plane, as shown in FIG. 3, by cutting a monocrystalline ingot 300 in a diagonally flat shape so as to cross the principal axis of the ingot at an inclination angle of θ around the <110> axis (while this is indicated as the axis in FIG. 3, the equivalent orientation group is hereinafter collectively referred to as the "<100> axis") which transects in the radial direction as the center of rotation, the cut plane will also become a plane inclined in the <100> orientation relative to the {100} plane. Note that, because the difference in angle between the <110> axis and the <100> axis on the {100} plane is 45°, a plane inclined in the <100> orientation relative to the {100} plane can be obtained by performing a similar cutting operation after rotating the silicon ingot 45° relative to the principal axis from the case of obtaining the foregoing plane inclined in the <110> orientation relative to the {100} plane.

Moreover, the body part of the sputtering target of embodiment of the present invention may also be obtained by diagonally grinding a product, which was obtained by cutting monocrystalline silicon having the {100} on-axis plane as its main surface at a predetermined thickness, so that the main surface will have an orientation inclined in a predetermined orientation relative to the {100} plane. A target body obtained with the foregoing methods can be processed into the sputtering target of the embodiment of the present invention by being subject to micro polishing, shaping, cleaning and bonding with a backing plate as needed after the foregoing processes of cutting or grinding.

EXAMPLES

The embodiments of the present invention are now explained in more detail based on specific examples. The following specific examples are provided for facilitating the understanding of the technical contents and the technical scope of the embodiments of the present invention are not limited by these specific examples.

Comparative Example 1: Conventional Example

A monocrystalline silicon plate having a {100} on-axis plane as a main surface was cut from a monocrystalline silicon ingot having a diameter of 460 mm that was pulled via the Czochralski method with a <100> direction as a pulling axis, subject to abrasive cleaning, processed into a sputtering target body having a thickness of 8 mm, and then bonded with a copper alloy backing plate via a bonding material made from indium and having a thickness of 0.3 mm. Moreover, a monocrystalline plate having a different {100} on-axis plane as a main surface was cut from the same silicon ingot, a monocrystalline silicon plate that underwent the same abrasive cleaning treatment was prepared, and this was used as a substrate for evaluating the strength of the target.

Because a monocrystalline silicon plate has anisotropy in its strength depending on the in-plane orientation, strength evaluation samples having a length of 100 mm, a width of 12 mm, and a thickness of 8 mm (target thickness) along orientations of the four angles of 0°, 15°, 30°, and 45° relative a baseline which passes through the center of the main surface to become the sputter surface were prepared, and the strength of each of these samples was evaluated pursuant to the deflective strength based on a three-point bending test according to JIS R 1601.

The following results were obtained with regard to Comparative Example 1; specifically, the mean value of the three-point bending strengths at angles of 0°, 15°, 30°, and 45° relative to a baseline which passes through a center of the sputter surface was 148.0 MPa, and the ratio relative to the mean value of the difference between the maximum value and the minimum value of the three-point bending strengths at the angles of 0°, 15°, 30°, and 45° ({(maximum value−minimum value)/mean value}×100(%)) was 5.2%.

Subsequently, the sputtering target of this example that was prepared separately from the foregoing strength evaluation sample was mounted on a sputtering device, and a performance evaluation of the target including a sputtering test was performed. The four evaluation items were as follows; specifically, average warping amount of the target surface after bonding with the backing plate, number of particles having a grain size of 2.0 µm or more that are observed upon performing continuous sputtering up to an integral power consumption of 130 kWh, relative ratio based on the sputtering rate of the {100} plane, and incidence of cracks based on the indentation of a penetrator for measuring the Vicker's hardness.

Among the above, the warping of the target surface is the mean value of the result of causing the straight gauge that is longer than the diameter of the target to come into contact with the target so as to pass through the center of the sputter surface, and measuring the gap at the periphery or center of the target by using a thickness gauge in four directions at 45° intervals. The warping of the target surface is a factor that directly affects the film thickness uniformity during deposition, and less warping the better. Moreover, the number of particles is preferably fewer, and the sputtering rate is preferably higher from the perspective of deposition efficiency.

Furthermore, the incidence of cracks is a percentage obtained by using a tetrahedral penetrator for indenting the target surface in the same manner upon measuring the Vicker's hardness, and repeating the operation of observing the indentation formed on the surface and determining whether or not there are cracks at the corners of the indentation so that the indentations at the 12 locations on the target surface are uniformly dispersed, and calculating (number of corners with cracks)/(total number of corners). This numerical value can be used as an index of the cracking susceptibility of a monocrystalline silicon target, which is a brittle material, and lower the value the better.

With regard to Comparative Example 1 as a conventional example, upon evaluating each of the foregoing characteristics, the average warping amount was 0.35 mm, the number of particles was 18 particles, the relative ratio of the sputter rate was 100% because this example is the reference, and the incidence of cracks was 40%.

Comparative Example 2: Angle of Inclination 1°

A monocrystalline silicon plate having a plane inclined 1° from a {100} on-axis plane as a main surface was cut from a monocrystalline silicon ingot having a diameter of 460 mm that was pulled via the Czochralski method with a <100> direction as a pulling axis. Here, plates having two types of inclined planes were prepared; specifically, a plate in which the {100} plane was rotated around the <110> axis, and a plate in which the {100} plane was rotated around the <100> axis. Each plate was subject to abrasive cleaning, processed into a sputtering target body having a thickness of 8 mm, and then bonded with a copper alloy backing plate. Moreover, monocrystalline silicon plates having the same inclination angle and the same thickness in the same two orientations were cut from the same silicon ingot and subject to the same abrasive cleaning treatment, and these plates were used as a substrate for evaluating the strength of the target.

Comparative Example 2 was also subject to the same strength evaluation as Comparative Example 1, and the mean value of the three-point bending strengths at the angles of 0°, 15°, 30°, and 45° relative to a baseline which passes through a center of the sputter surface was 144.5 MPa with the inclination orientation of <100>, and was 146.4 MPa with the inclination orientation of <110>. Moreover, the ratio relative to the mean value of the difference between the maximum value and the minimum value of the three-point bending strengths at the angles of 0°, 15°, 30°, and 45° was 4.9% with the inclination orientation of <100>, and was 6.5% with the inclination orientation of <110>.

The sputtering target of this example was also evaluated based on the same tests as Comparative Example 1. Consequently, with the inclination orientation of <100>, the average warping amount was 0.38 mm, the number of particles was 19 particles, the relative ratio of the sputter rate was 100.4%, and the incidence of cracks was 44%. Moreover, with the inclination orientation of <110>, the average warping amount was 0.35 mm, the number of particles was 25 particles, the relative ratio of the sputter rate was 100.5%, and the incidence of cracks was 42%. It was confirmed that all characteristics of warping, number of particles, sputter rate, and incidence of cracks of both targets having the inclination orientations of <100> and <110> were inferior in comparison to Example 1.

Example 1: Angle of Inclination 2°

A monocrystalline silicon plate having a plane inclined 2° from a {100} on-axis plane as a main surface was cut from a monocrystalline silicon ingot having a diameter of 460 mm that was pulled via the Czochralski method with a <100> direction as a pulling axis in the same manner as Comparative Example 2 other than the inclination angle, and the strength was evaluated. In Example 1, the mean value of the three-point bending strengths at the angles of 0°, 15°, 30°, and 45° relative to a baseline which passes through a center of the sputter surface was 157.6 MPa with the inclination orientation of <100>, and was 150.1 MPa with the inclination orientation of <110>. Moreover, the ratio relative to the mean value of the difference between the maximum value and the minimum value of the three-point bending strengths at the angles of 0°, 15°, 30°, and 45° was 3.1% with the inclination orientation of <100>, and was 2.9% with the inclination orientation of <110>.

The sputtering target of this example was also evaluated based on the same tests as Comparative Example 1. Consequently, with the inclination orientation of <100>, the average warping amount was 0.32 mm, the number of particles was 16 particles, the relative ratio of the sputter rate was 101.0%, and the incidence of cracks was 35%. Moreover, with the inclination orientation of <110>, the average warping amount was 0.33 mm, the number of particles was 14 particles, the relative ratio of the sputter rate was 100.9%, and the incidence of cracks was 38%. It was confirmed that all characteristics of warping, number of particles, sputter rate, and incidence of cracks of both targets having the inclination orientations of <100> and <110> have considerably improved in comparison to Comparative Example 1.

Example 2: Angle of Inclination 4°

A monocrystalline silicon plate having a plane inclined 4° from a {100} on-axis plane as a main surface was cut from a monocrystalline silicon ingot having a diameter of 460 mm that was pulled via the Czochralski method with a <100> direction as a pulling axis in the same manner as Comparative Example 2 other than the inclination angle, and the strength was evaluated. In Example 2, the mean value of the three-point bending strengths at the angles of 0°, 15°, 30°, and 45° relative to a baseline which passes through a center of the sputter surface was 167.8 MPa with the inclination orientation of <100>, and was 162.7 MPa with the inclination orientation of <110>. Moreover, the ratio relative to the mean value of the difference between the maximum value and the minimum value of the three-point bending strengths at the angles of 0°, 15°, 30°, and 45° was 1.9% with the inclination orientation of <100>, and was 2.2% with the inclination orientation of <110>.

The sputtering target of this example was also evaluated based on the same tests as Comparative Example 1. Consequently, with the inclination orientation of <100>, the average warping amount was 0.27 mm, the number of particles was 8 particles, the relative ratio of the sputter rate was 102.2%, and the incidence of cracks was 27%. Moreover, with the inclination orientation of <110>, the average warping amount was 0.28 mm, the number of particles was 10 particles, the relative ratio of the sputter rate was 101.8%, and the incidence of cracks was 27%. In this example, the number of particles was 10 or less in both inclination orientations, and extremely favorable particle characteristics were obtained. It was also confirmed that the characteristics of warping, sputter rate, and incidence of cracks of both targets having the inclination orientations of <100> and <110> have considerably improved in comparison to Comparative Example 1.

Example 3: Angle of Inclination 6°

A monocrystalline silicon plate having a plane inclined 6° from a {100} on-axis plane as a main surface was cut from a monocrystalline silicon ingot having a diameter of 460 mm that was pulled via the Czochralski method with a <100> direction as a pulling axis in the same manner as Comparative Example 2 other than the inclination angle, and the strength was evaluated. In Example 3, the mean value of the three-point bending strengths at the angles of 0°, 15°, 30°, and 45° relative to a baseline which passes through a center of the sputter surface was 165.3 MPa with the inclination orientation of <100>, and was 158.3 MPa with the inclination orientation of <110>. Moreover, the ratio relative to the mean value of the difference between the maximum value and the minimum value of the three-point bending strengths at the angles of 0°, 15°, 30°, and 45° was 2.0% with the inclination orientation of <100>, and was 2.5% with the inclination orientation of <110>.

The sputtering target of this example was also evaluated based on the same tests as Comparative Example 1. Consequently, with the inclination orientation of <100>, the average warping amount was 0.30 mm, the number of particles was 11 particles, the relative ratio of the sputter rate was 102.4%, and the incidence of cracks was 29%. Moreover, with the inclination orientation of <110>, the average warping amount was 0.32 mm, the number of particles was 10 particles, the relative ratio of the sputter rate was 102.2%, and the incidence of cracks was 38%. In this example, favorable particle characteristics were obtained for both orientations, and it was also confirmed that the characteristics of warping, sputter rate, and incidence of cracks of both targets have considerably improved in comparison to Comparative Example 1.

Example 4: Angle of Inclination 8°

A monocrystalline silicon plate having a plane inclined 8° from a {100} on-axis plane as a main surface was cut from a monocrystalline silicon ingot having a diameter of 460 mm that was pulled via the Czochralski method with a <100> direction as a pulling axis in the same manner as Comparative Example 2 other than the inclination angle, and the strength was evaluated. In Example 4, the mean value of the three-point bending strengths at the angles of 0°, 15°, 30°, and 45° relative to a baseline which passes through a center of the sputter surface was 154.5 MPa with the inclination orientation of <100>, and was 151.3 MPa with the inclination orientation of <110>. Moreover, the ratio relative to the mean value of the difference between the maximum value and the minimum value of the three-point bending strengths at the angles of 0°, 15°, 30°, and 45° was 2.4% with the inclination orientation of <100>, and was 3.2% with the inclination orientation of <110>.

The sputtering target of this example was also evaluated based on the same tests as Comparative Example 1. Consequently, with the inclination orientation of <100>, the average warping amount was 0.30 mm, the number of particles was 13 particles, the relative ratio of the sputter rate was 102.6%, and the incidence of cracks was 33%. Moreover, with the inclination orientation of <110>, the average warping amount was 0.33 mm, the number of particles was 15 particles, the relative ratio of the sputter rate was 102.3%, and the incidence of cracks was 35%. Favorable particle characteristics were obtained for both orientations, and, while slightly inferior to Example 1 and Example 2, it was also confirmed that the various characteristics, including the particle characteristics, have improved in comparison to Comparative Example 1 as a conventional example.

Comparative Example 3: Angle of Inclination 10°

A monocrystalline silicon plate having a plane inclined 10° from a {100} on-axis plane as a main surface was cut from a monocrystalline silicon ingot having a diameter of 460 mm that was pulled via the Czochralski method with a <100> direction as a pulling axis in the same manner as Comparative Example 2 other than the inclination angle, and the strength was evaluated. In Comparative Example 3, the mean value of the three-point bending strengths at the angles of 0°, 15°, 30°, and 45° relative to a baseline which passes through a center of the sputter surface was 140.8 MPa with the inclination orientation of <100>, and was 121.9 MPa with the inclination orientation of <110>. Moreover, the ratio relative to the mean value of the difference between the maximum value and the minimum value of the three-point bending strengths at the angles of 0°, 15°, 30°, and 45° was 3.3% with the inclination orientation of <100>, and was 4.0% with the inclination orientation of <110>.

The sputtering target of this example was also evaluated based on the same tests as Comparative Example 1. Consequently, with the inclination orientation of <100>, the average warping amount was 0.38 mm, the number of particles was 20 particles, the relative ratio of the sputter rate was 103.1%, and the incidence of cracks was 50%. Moreover, with the inclination orientation of <110>, the average warping amount was 0.42 mm, the number of particles was 22 particles, the relative ratio of the sputter rate was 102.5%, and the incidence of cracks was 58%. While it was confirmed that the sputter rate increased in comparison to Comparative Example 1 for both inclination orientations, it was confirmed that all other characteristics had deteriorated in comparison to Comparative Example 1 as a conventional example.

Comparative Example 4: Angle of Inclination 20°

A monocrystalline silicon plate having a plane inclined 20° from a {100} on-axis plane as a main surface was cut from a monocrystalline silicon ingot having a diameter of 460 mm that was pulled via the Czochralski method with a <100> direction as a pulling axis in the same manner as Comparative Example 2 other than the inclination angle, and the strength was evaluated. In Comparative Example 4, the mean value of the three-point bending strengths at the angles of 0°, 15°, 30°, and 45° relative to a baseline which passes through a center of the sputter surface was 142.5 MPa with the inclination orientation of <100>, and was 136.3 MPa with the inclination orientation of <110>. Moreover, the ratio relative to the mean value of the difference between the maximum value and the minimum value of the three-point bending strengths at the angles of 0°, 15°, 30°, and 45° was 4.3% with the inclination orientation of <100>, and was 7.7% with the inclination orientation of <110>.

The sputtering target of this example was also evaluated based on the same tests as Comparative Example 1. Consequently, with the inclination orientation of <100>, the average warping amount was 0.40 mm, the number of particles was 23 particles, the relative ratio of the sputter rate was 103.9%, and the incidence of cracks was 54%. Moreover, with the inclination orientation of <110>, the average warping amount was 0.39 mm, the number of particles was 29 particles, the relative ratio of the sputter rate was 103.7%, and the incidence of cracks was 54%. In this example, while it was confirmed that the sputter rate increased for both inclination orientations, it was confirmed that all other characteristics had deteriorated in comparison to Comparative Example 1 as a conventional example.

The foregoing results are summarized in Table 1. With regard to the respective evaluation items, those in which the average bending strength is greater than 155 MPa are indicated with a double circle (⊚), those within the range of 150 to 155 MPa are indicated with a circle (○), and those less than 150 MPa are indicated with a triangle (△). Those in which the average warping amount is less than 0.30 mm are indicated with a double circle (⊚), those within the range of 0.30 to 0.35 mm are indicated with a circle (○), and those exceeding 0.35 mm are indicated with a triangle (△). Those in which the number of particles is less than 10 particles are indicated with a double circle (⊚), those within the range of 10 to 20 particles are indicated with a circle (○), and those exceeding 20 particles are indicated with a triangle (△). With regard to the sputter rate, those exceeding 102% relative to Comparative Example 1 are indicated with a double circle (⊚), and those within the range of 100 to 102% are indicated with a circle (○). Furthermore, those in which the incidence of cracks is less than 35% are indicated with a double circle (⊚), those within the range of 35 to 50% are indicated with a circle (○), and those exceeding 50% are indicated with a triangle (△). Moreover, a double circle (⊚), a circle (○), and a triangle (△) are respectively given 5 points, 3 points, and 1 point, and, as a comprehensive evaluation, those in which the total score exceeds 15 points is represented as a double circle (⊚), and those in which the total score is 15 points or less is represented as an x-mark (x).

TABLE 1

| | Inclination angle | Inclination orientation | Max/Min difference of bending strength | Average bending strength (MPa) | Evaluation | Average warping amount (mm) | Evaluation |
|---|---|---|---|---|---|---|---|
| Comparative Example 1 | 0° | — | 5.2% | 148.0 | △ | 0.35 | ○ |
| Comparative Example 2 | 1° | <100> | 4.9% | 144.5 | △ | 0.38 | △ |
| | | <110> | 6.5% | 146.4 | △ | 0.35 | ○ |
| Example 1 | 2° | <100> | 3.1% | 157.6 | ⊚ | 0.32 | ○ |
| | | <110> | 2.9% | 150.1 | ○ | 0.33 | ○ |
| Example 2 | 4° | <100> | 1.9% | 167.8 | ⊚ | 0.27 | ⊚ |
| | | <110> | 2.2% | 162.7 | ⊚ | 0.28 | ⊚ |
| Example 3 | 6° | <100> | 2.0% | 165.3 | ⊚ | 0.30 | ○ |
| | | <110> | 2.5% | 158.3 | ⊚ | 0.32 | ○ |
| Example 4 | 8° | <100> | 2.4% | 154.5 | ○ | 0.30 | ○ |
| | | <110> | 3.2% | 151.3 | ○ | 0.33 | ○ |
| Comparative Example 3 | 10° | <100> | 3.3% | 140.8 | △ | 0.38 | △ |
| | | <110> | 4.0% | 121.9 | △ | 0.42 | △ |
| Comparative Example 4 | 20° | <100> | 4.3% | 142.5 | △ | 0.40 | △ |
| | | <110> | 7.7% | 136.3 | △ | 0.39 | △ |

| | Number of particles (Particles) | Evaluation | Sputter rate (%) | Evaluation | Incidence of cracks (%) | Evaluation | Sputter characteristics (Overall evaluation) |
|---|---|---|---|---|---|---|---|
| Comparative Example 1 | 18 | ○ | 100.0 | ○ | 40 | ○ | x |
| Comparative Example 2 | 19 | ○ | 100.4 | ○ | 44 | ○ | x |
| | 25 | △ | 100.5 | ○ | 42 | ○ | x |
| Example 1 | 16 | ○ | 101.0 | ○ | 35 | ○ | ⊚ |
| | 14 | ○ | 100.9 | ○ | 38 | ○ | ⊚ |
| Example 2 | 8 | ⊚ | 102.2 | ⊚ | 27 | ⊚ | ⊚ |
| | 10 | ○ | 101.8 | ○ | 27 | ⊚ | ⊚ |
| Example 3 | 11 | ○ | 102.4 | ⊚ | 29 | ⊚ | ⊚ |
| | 10 | ○ | 102.2 | ⊚ | 38 | ○ | ⊚ |
| Example 4 | 13 | ○ | 102.6 | ⊚ | 33 | ⊚ | ⊚ |
| | 15 | ○ | 102.3 | ⊚ | 35 | ○ | ⊚ |
| Comparative Example 3 | 20 | △ | 103.1 | ⊚ | 50 | ○ | x |
| | 22 | △ | 102.5 | ⊚ | 58 | △ | x |
| Comparative Example 4 | 23 | △ | 103.9 | ⊚ | 54 | △ | x |
| | 29 | △ | 103.7 | ⊚ | 54 | △ | x |

According to the embodiment of the present invention, it is possible to provide a sputtering target formed from monocrystalline silicon capable of exhibiting the same level of sputtering performance as a target in which the sputter surface is substantially a {100} plane, improving the fracture endurance against stress caused by deviation in the thermal load during sputtering, preventing the cracking of the target throughout the target life, and enabling deposition with few particles. Thus, not only is the present invention useful for silicon-based electronic devices, a huge contribution can be expected in numerous industrial fields that use silicon or silicon compound thin films such as devices made from composite materials and optical components.

The invention claimed is:

1. A sputtering target formed from monocrystalline silicon, wherein the sputtering target has a sputter surface which is parallel to a plane inclined at an angle exceeding 1° and less than 10° from a {100} plane of the monocrystalline silicon.

2. The sputtering target according to claim 1, wherein the sputtering target has a mean value of three-point bending strengths of 150 MPa or more, the three-point bending strengths being measured with four specimen cut in a strip form such that longer edges of the four specimen make an angle of 0°, 15°, 30°, and 45°, respectively, with a baseline contained in the sputter surface and passing through a center of the sputter surface.

3. The sputtering target according to claim 2, wherein the three-point bending strengths contain maximum and a minimum bending strengths, and wherein a ratio of a difference between the maximum and the minimum bending strengths to a mean value of the three-point bending strengths is 4.0% or less.

4. The sputtering target according to claim 3, wherein the plane inclined at an angle from the {100} plane of the monocrystalline silicon contains a <110> direction as an axis of rotation in making the inclination.

5. The sputtering target according to claim 4, wherein the angle is 2° or more and 8° or less.

6. The sputtering target according to claim 5, wherein the monocrystalline silicon contains a p-type dopant or an n-type dopant.

7. The sputtering target according to claim 6, wherein the sputtering target has a diameter of 300 mm or more.

8. The sputtering target according to claim 7, wherein the sputtering target has a thickness of 4 mm or more.

9. The sputtering target according to claim 3, wherein the plane inclined at an angle from the {100} plane of the monocrystalline silicon contains a <100> direction as an axis of rotation in making the inclination.

10. The sputtering target according to claim 9, wherein the angle is 2° or more and 8° or less.

11. The sputtering target according to claim 10, wherein the monocrystalline silicon contains a p-type dopant or an n-type dopant.

12. The sputtering target according to claim 11, wherein the sputtering target has a diameter of 300 mm or more.

13. The sputtering target according to claim 12, wherein the sputtering target has a thickness of 4 mm or more.

14. The sputtering target according to claim 1, wherein the angle is 2° or more and 8° or less.

15. The sputtering target according to claim 1, wherein the monocrystalline silicon contains a p-type dopant or an n-type dopant.

16. The sputtering target according to claim 1, wherein the sputtering target has a diameter of 300 mm or more.

17. The sputtering target according to claim 1, wherein the sputtering target has a thickness of 4 mm or more.

* * * * *